(12) United States Patent
Song et al.

(10) Patent No.: US 10,804,334 B2
(45) Date of Patent: Oct. 13, 2020

(54) ORGANIC LIGHT EMITTING DIODE DISPLAY INCLUDING COLOR CONVERSION PANEL

(71) Applicant: SAMSUNG DISPLAY CO., LTD., Yongin-si, Gyeonggi-do (KR)

(72) Inventors: In Seok Song, Pocheon-si (KR); Sun-Kyu Joo, Suwon-si (KR); Byung-Chul Kim, Suwon-si (KR); In Ok Kim, Osan-si (KR); Gak Seok Lee, Hwaseong-si (KR); Chang-Soon Jang, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 16/240,117

(22) Filed: Jan. 4, 2019

(65) Prior Publication Data

US 2019/0348470 A1 Nov. 14, 2019

(30) Foreign Application Priority Data

May 14, 2018 (KR) .......................... 10-2018-0054711

(51) Int. Cl.
*H01L 27/32* (2006.01)
*H01L 51/52* (2006.01)

(52) U.S. Cl.
CPC ........ *H01L 27/322* (2013.01); *H01L 27/3272* (2013.01); *H01L 51/5268* (2013.01)

(58) Field of Classification Search
None
See application file for complete search history.

(56) References Cited

U.S. PATENT DOCUMENTS

| 2006/0210708 A1* | 9/2006 | Rho | G02B 5/201 |
| | | | 427/162 |
| 2011/0084290 A1* | 4/2011 | Nakamura | H01L 27/322 |
| | | | 257/89 |

FOREIGN PATENT DOCUMENTS

| EP | 3 339 920 | 6/2018 |
| JP | 2009193801 | 7/2000 |
| JP | 2004139849 | 5/2004 |
| JP | 2005002290 | 1/2005 |
| JP | 2005123088 | 5/2005 |

(Continued)

OTHER PUBLICATIONS

Extended European Search Report dated Oct. 14, 2019 for European Application Serial No. 19166322.8.

*Primary Examiner* — Herve-Louis Y Assouman
(74) *Attorney, Agent, or Firm* — F. Chau & Associates, LLC

(57) ABSTRACT

An organic light emitting diode display includes: a display panel; and a color conversion panel positioned on the display panel. The color conversion panel includes: a substrate; a color filter layer disposed under the substrate; a first light blocking layer disposed under the color filter layer; and a first color conversion layer, a second color conversion layer, and a third color conversion layer positioned under the first light blocking layer. The color filter layer includes a first color filter, a second color filter, and a third color filter, the first light blocking layer includes a first portion that overlaps the first color filter, a second portion that overlaps the second color filter, and a third portion that overlaps the third color filter, and the first portion, the second portion, and the third portion are connected.

20 Claims, 21 Drawing Sheets

(56) References Cited

FOREIGN PATENT DOCUMENTS

| | | |
|---|---|---|
| JP | 2009224063 | 10/2009 |
| KR | 10-2000-0034688 | 6/2000 |
| KR | 10-0966546 | 6/2010 |
| KR | 10-2016-0056493 | 5/2016 |
| KR | 10-2017-0014755 | 2/2017 |
| KR | 10-2017-0027916 | 3/2017 |
| KR | 10-2017-0124122 | 11/2017 |
| WO | WO2013111696 | 8/2013 |

* cited by examiner

ORGANIC LIGHT EMITTING DIODE DISPLAY INCLUDING COLOR CONVERSION PANEL

CROSS-REFERENCE TO RELATED APPLICATION

This application claims priority under 35 U.S.C. § 119 from, and the benefit of, Korean Patent Application No. 10-2018-0054711 filed in the Korean Intellectual Property Office on May 14, 2018, the contents of which are herein incorporated by reference in their entirety.

BACKGROUND

(a) Technical Field

Embodiments of the present disclosure are directed to an organic light emitting diode display that includes a color conversion panel.

(b) Discussion of the Related Art

An organic light emitting diode (OLED) display includes two electrodes and an organic emission layer interposed therebetween, wherein electrons injected from one electrode, such as a cathode, and holes injected from the other electrode, such as an anode, are combined in the organic emission layer to generate excitons, and the excitons release energy by emitting light.

A display device that includes an organic emission layer can implement red, green, blue, etc., according to the wavelength of the emitted light. Recently, to improve color reproducibility and luminance, a display device that includes a color conversion panel that uses quantum dots has been proposed.

However, in these color conversion panels, external light incident on the color conversion panel is reflected by the quantum dots or other scatterers, so that light extraction efficiency drops and the reflected external light is visually recognized by the user, which deteriorates the display quality.

SUMMARY

Exemplary embodiments can provide an organic light emitting diode display in which externally incident light is prevented from being reflected by quantum dots or other scatterers, and that includes a color conversion panel with improved extraction efficiency and display quality.

An organic light emitting diode display according to an exemplary embodiment includes: a display panel; and a color conversion panel disposed on the display panel. The color conversion panel includes: a substrate; a color filter layer disposed under the substrate; a first light blocking layer disposed under the color filter layer; and a first color conversion layer, a second color conversion layer, and a third color conversion layer disposed under the first light blocking layer. The color filter layer includes a first color filter, a second color filter, and a third color filter, the first light blocking layer includes a first portion that overlaps the first color filter, a second portion that overlaps the second color filter, and a third portion that overlaps the third color filter, and the first portion, the second portion, and the third portion are connected.

The color conversion panel may include a first light blocking member disposed under the substrate and positioned between at least one pair of adjacent, different color filters.

The color conversion panel may further include a second light blocking member disposed under the color filter layer and positioned between at least one pair of adjacent, different color conversion layers.

A height of the first light blocking member may be higher than a height of the first color filter, the second color filter, or the third color filter.

The color conversion panel may include a second light blocking member disposed under the color filter layer and positioned between at least one pair of adjacent, different color conversion layers.

The color conversion panel may further include a second light blocking layer disposed under the substrate.

A refractive index of the first light blocking layer may be greater than a refractive index of the first color filter, the second color filter, or the third color filter, and the refractive index of the first light blocking layer ranges from 1.9 to 2.1.

A refractive index of the first light blocking layer may be less than the refractive index of the first color conversion layer, the second color conversion layer, or the third color conversion layer, and the refractive index of the first light blocking layer ranges from 1.2 to 1.5.

The first light blocking layer may include a low refractive index layer and a high refractive index layer.

An organic light emitting diode display according to an exemplary embodiment includes: a display panel; and a color conversion panel disposed on the display panel. The color conversion panel includes: a substrate; a second light blocking layer disposed under the substrate; a color filter layer disposed under the second light blocking layer, where the color filter layer includes a first color filter, a second color filter, and a third color filter; and a first color conversion layer, a second color conversion layer, and a third color conversion layer respectively disposed under the first color filter, the second color filter, and the third color filter. The second light blocking layer includes a first portion that overlaps the first color filter, a second portion that overlaps the second color filter, and a third portion that overlaps the third color filter, and the first portion, the second portion, and the third portion are connected.

The color conversion panel may include a first light blocking member disposed under the substrate and positioned between at least one pair of adjacent, different color filters.

The color conversion panel may include a second light blocking member disposed under the color filter layer and positioned between at least one pair of adjacent, different conversion layers.

The color conversion panel may include a first light blocking layer disposed between the first color conversion layer, the second color conversion layer, and the third color conversion layer, and the first color filter, the second color filter, and the third color filter. The first light blocking layer includes a first portion that overlaps the first color filter, a second portion that overlaps the second color filter, and a third portion that overlaps the third color filter; and the first portion, the second portion, and the third portion may be connected.

A refractive index of the second light blocking layer may be less than a refractive index of the first color filter, the second color filter, or the third color filter. The refractive index of the second light blocking layer may range from 1.2 to 1.5.

A refractive index of the second light blocking layer may be greater than the refractive index of the substrate. The refractive index of the second light blocking layer may range from 1.9 to 2.1.

An organic light emitting diode display according to an exemplary embodiment includes: a display panel; and a color conversion panel disposed on the display panel. The color conversion panel includes: a substrate; a color filter layer disposed under the substrate; a first light blocking layer disposed under the color filter layer; a first color conversion layer, a second color conversion layer, and a third color conversion layer disposed under the first light blocking layer; and a second light blocking member disposed under the color filter layer and positioned between color conversion layers. The color filter layer includes a first color filter, a second color filter, and a third color filter, the first light blocking layer includes a first portion that overlaps the second light blocking member in a plan view and a second portion that overlaps the color filter layer, and the first portion is disposed under the second light blocking member.

The color conversion panel may further include a first light blocking member disposed under the substrate and positioned between at least one pair of adjacent, different color filters.

The first color conversion layer and the second color conversion layer may each include a quantum dot, and the third color conversion layer may include a scatterer.

A reflection preventing layer may be further included on the substrate.

The first light blocking layer may include at least one of ITO, IZO, or SiNx.

According to exemplary embodiments, external incident light prevented from being reflected by the quantum dots or the scatterers such that an organic light emitting diode display that includes the color conversion panel with improved light emission efficiency and display quality may be provided.

DETAILED DESCRIPTION OF EXEMPLARY EMBODIMENTS

Figure 1:
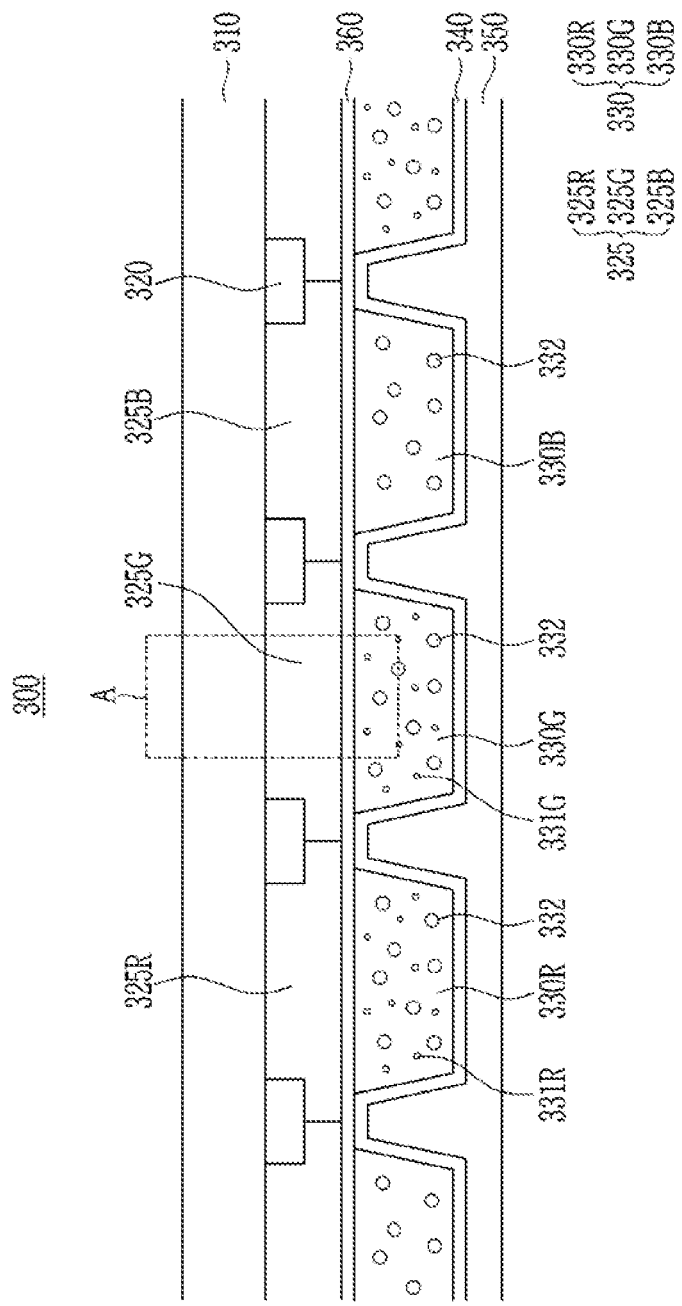
FIG. 1 is a cross-sectional view of a color conversion panel according to an exemplary embodiment.

Embodiments of the present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present invention.

In the drawings, the size and thickness of each configuration are arbitrarily shown for better understanding and ease of description, but embodiments are not limited thereto. In addition, the thickness of layers, films, panels, regions, etc., may be exaggerated for clarity. The same reference numerals may be attached to the same or similar constituent elements through the entire specification.

It will be understood that when an element such as a layer, film, region, or substrate is referred to as being "on" another element, it can be directly on the other element or intervening elements may also be present.

Now, a color conversion panel according to an exemplary embodiment will be described with reference to FIG. 1, FIG. 2, and FIG. 3.

FIG. 1 is a cross-sectional view of a color conversion panel 300 according to an exemplary embodiment.

The color conversion panel 300 according to an exemplary embodiment includes a second substrate 310, a first light blocking member 320 and a color filter layer 325 positioned under the second substrate 310, a first light blocking layer 360 positioned under the color filter layer 325, a color conversion layer 330 positioned under the first light blocking layer 360, a light filter layer 340 positioned under the color conversion layer 330, and a planarization layer 350 positioned under the light filter layer 340.

According to an exemplary embodiment, the second substrate 310 is formed as an insulating substrate made of glass, quartz, ceramic, plastic, etc., and is a flexible substrate. However, embodiments of the present disclosure are not limited thereto, and various other materials may be used.

According to an exemplary embodiment, the first light blocking member 320 is positioned under the second substrate 310. The first light blocking member 320 has a lattice structure that forms a space as an opening for displaying an image, and is formed of a material that blocks light. FIG. 1 is a cross-sectional view that shows a structure in which first light blocking members 320 are separated by a predetermined interval.

According to an exemplary embodiment, the color filter layer 325 includes a first color filter 325R, a second color filter 325G, and a third color filter 325B. The first color filter 325R is positioned on a pixel that displays red, transmits light in the red wavelength band, and blocks light in other wavelength bands. The second color filter 325G is positioned on the pixel that displays green, transmits light in the green wavelength band, and blocks light in other wavelength bands. The third color filter 325B is positioned on a pixel that displays blue, transmits light in the blue wavelength band, and blocks light in other wavelength bands. The color filter layer 325 prevents external light in color wavelength bands that differ from the emitted color from being incident to the color conversion panel 300.

According to an exemplary embodiment, the first light blocking member 320 is positioned between at least one pair of adjacent, different color filters, i.e., between the first color filter 325R and the second color filter 325G, between the second color filter 325G and the third color filter 325B, or between the third color filter 325B and the first color filter 325R. That is, the color filter layer 325 is positioned in the openings of the first light blocking member 320.

According to an exemplary embodiment, the first light blocking layer 360 is positioned under the color filter layer 325. The first light blocking layer 360 is substantially flat, and is positioned under the entire bottom surface of the color filter layer 325. The first light blocking layer 360 includes a first portion that overlaps the first color filter, a second portion that overlaps the second color filter, and a third portion that overlaps the third color filter. The first portion, the second portion, and the third portion are connected.

According to an exemplary embodiment, a refractive index of the first light blocking layer 360 may be less than a refractive index of an adjacent constituent element of the color conversion panel 300. In particular, the refractive index of the first light blocking layer 360 is less than the refractive index of the color conversion layer 330. For example, the refractive index of the first light blocking layer 360 may range from 1.2 to 1.5.

On the other hand, according to an exemplary embodiment, the refractive index of the first light blocking layer 360 may be greater than the refractive indices of other constituent elements of the adjacent color conversion panel 300. In particular, the refractive index of the first light blocking layer 360 may be greater than the refractive index of the color filter layer 325. For example, the refractive index of the first light blocking layer 360 may range from 1.9 to 2.1. The first light blocking layer 360 may be a transparent conductive layer such as ITO, IZO, etc., or may include an inorganic insulating material, such as a nitride such as SiNx, etc.

According to an exemplary embodiment, when the refractive index of the first light blocking layer 360 exceeds 1.5 and less than 1.9, because of differences between the refractive indices for the adjacent layers, the color conversion panel 300 may have unexpected effects, and when the refractive index of the first light blocking layer 360 exceeds 2.1 or is less than 1.2, the path of the light emitted from the display device is affected, which can reduce the light emission efficiency of the display device.

However, according to an embodiment, since the first light blocking layer 360 has either a high refractive index, i.e., a refractive index of 1.9 to 2.1, or a low refractive index, i.e., a refractive index of 1.2 to 1.5, external light incident to the color conversion panel 300 can be prevented from being incident to the color conversion layer 330 and light emission efficiency can be increased. The detailed effects of the first light blocking layer 360 are described with regard to FIG. 2 and FIG. 3.

According to an embodiment, the color conversion layer 330 is positioned under the first light blocking layer 360, and the color conversion layer 330 includes a first color conversion layer 330R, a second color conversion layer 330G, and a third color conversion layer 330B.

According to an embodiment, the first color conversion layer 330R converts received light into red light. For this, the first color conversion layer 330R includes red phosphors, and the red phosphor is at least one of (Ca, Sr, Ba)S, (Ca, Sr, Ba)$_2$Si$_5$N$_8$, CaAlSiN$_3$, CaMoO$_4$, or Eu$_2$Si$_5$N$_8$. In addition, the first color conversion layer 330R includes quantum dots 331R. The quantum dots 331R convert incident light into red light. The first color conversion layer 330R may further include scatterers 332. The light emitted to the first color conversion layer 330R is blue.

According to an embodiment, the second color conversion layer 330G converts received light into green light. The second color conversion layer 330G includes green phosphor, and the green phosphor is one of yttrium aluminum garnet (YAG), (Ca, Sr, Ba)$_2$SiO$_4$, SrGa$_2$S$_4$, BAM, α-SiAlON, β-SiAlON, Ca$_3$Sc$_2$Si$_3$O$_{12}$, Tb$_3$Al$_5$O$_{12}$, BaSiO$_4$, CaAlSiON, or (Sr$_{1-x}$Ba$_x$)Si$_2$O$_2$N$_2$. In this case, the x of (Sr$_{1-x}$Ba$_x$)Si$_2$O$_2$N$_2$ may be any number between 0 and 1. In addition, the second color conversion layer 330G includes quantum dots 331G. The quantum dots 331G convert incident light into green light. The second color conversion layer 330G further includes scatterers 332. The light emitted to the second color conversion layer 330G blue.

According to an embodiment, the third color conversion layer 330B converts received light into blue light. When the received light is blue, the third color conversion layer 330B can be a transmission layer that transmits the incident blue light. When the third color conversion layer 330B is a transmission layer, the third color conversion layer 330B includes a transparent polymer that transmits blue when the received blue light is transmitted. In addition, the third color conversion layer 330B corresponds to the region that includes a material that emits the incident blue without separate phosphors or quantum dots, but may include the scatterers 332. The first color conversion layer 330R, the second color conversion layer 330G, and the third color conversion layer 330B may be repeated and arranged under the substrate, and the arrangement order may vary.

According to an embodiment, the first color conversion layer 330R is positioned by the pixel that displays red, and overlaps the first color filter 325R. The second color conversion layer 330G is positioned by the pixel that displays green, and overlaps the second color filter 325G. The third color conversion layer 330B is positioned by the pixel displaying blue, and overlaps the third color filter 325B.

The color conversion panel 300 according to an exemplary embodiment of FIG. 1 includes a light filter layer 340 positioned under the color conversion layer 330. The light filter layer 340 has a structure in which a plurality of layers having different refractive indices are stacked. For example, the light filter layer 340 can include a structure in which inorganic films having a high refractive index and inorganic films having a low refractive index are alternately stacked about 10 to 20 times. The light filter layer 340 more efficiently transmits the incident light, or may be omitted according to an exemplary embodiment.

In addition, according to an embodiment, the planarization layer 350 is positioned under the light filter layer 340. The planarization layer 350 removes steps caused by different heights of the first color conversion layer 330R, the second color conversion layer 330G, and the third color conversion layer 330B, and provides a flattened surface. The planarization layer 350 may be omitted depending on an exemplary embodiment.

Next, light characteristics of the first light blocking layer 360 will be described in detail with reference to FIG. 2 and FIG. 3. Hereinafter, a green pixel is mainly described, however the description is applicable to the first light blocking layer 360 positioned at the red or blue pixels.

Figure 2:
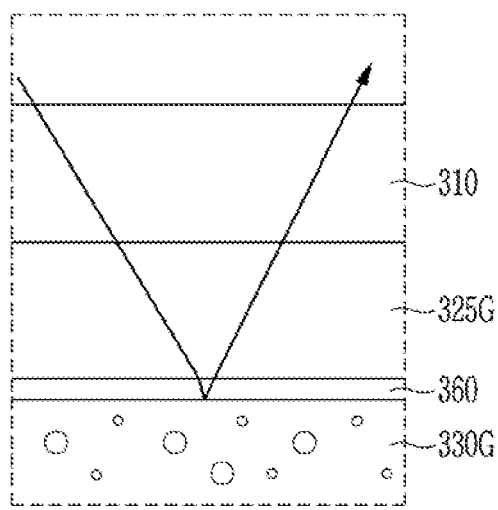
FIG. 2 and FIG. 3 are enlarged views of a portion A of a color conversion panel of FIG. 1.
Figure 3:
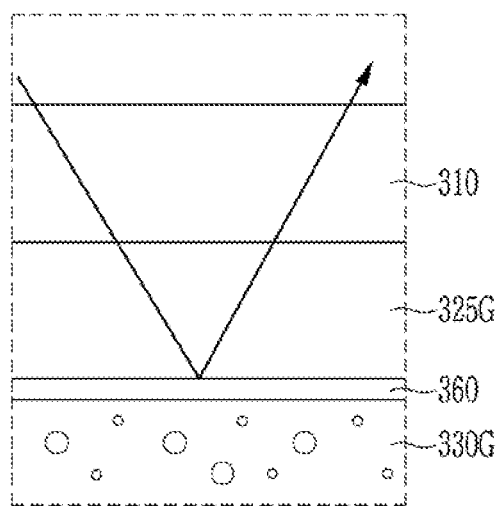

FIG. 2 and FIG. 3 are enlarged views of a portion A of a color conversion panel of FIG. 1, and FIG. 2 is firstly described.

According to an embodiment, FIG. 2 is an enlarged view of the portion A of the color conversion panel 300 of FIG. 1 when the first light blocking layer 360 has a low refractive index, i.e., a refractive index of 1.2 to 1.5. If the first light blocking layer 360 is omitted, externally incident light incident sequentially passes through the second substrate 310 and the second color filter 325G, and then reaches the second color conversion layer 330G. The external light is reflected by the scatterer 332 or the quantum dot 331G of the second color conversion layer 330G, and propagates back toward the second substrate 310. Accordingly, the light emission efficiency decreases by the reflection of the external light and the external light is recognized by the user, which decreases the display quality.

In general, as light passes through layers of different refractive indices, both refraction and reflection occur. When light propagates to a high refractive index layer from a low refractive index layer, there is greater reflectance at the interface than in the opposite case. That is, referring to FIG. 2, if the color conversion panel 300 includes a low refractive index first light blocking layer 360, the refractive index of the second color conversion layer 330G is greater than the refractive index of the first light blocking layer 360. Accordingly, the external light is incident to the low refractive index first light blocking layer 360 after sequentially passing through the second substrate 310 and the second color filter 325G, and then is reflected back without being incident into the second color conversion layer 330G due to the difference between the refractive indices of the first light blocking layer 360 and the second color conversion layer 330G.

On the other hand, according to an embodiment, FIG. 3 shows a case in which the first light blocking layer 360 has a high refractive index, i.e., a refractive index of 1.9 to 2.1, and is an enlarged view of the portion A of the color conversion panel 300 of FIG. 1. In this case, the refractive index of the first light blocking layer 360 is greater than the refractive index of the second color filter 325G. Accordingly, the external light is not incident into the second color conversion layer 330G due to difference between the refractive indices of the second color filter 325G and the first light blocking layer 360, and is reflected back after sequentially passing through the second substrate 310 and the second color filter 325G.

As described above, the color conversion panel 300 according to an exemplary embodiment of FIG. 1 includes the color filter layer 325, the color conversion layer 330 and a low refractive index or a high refractive index first light blocking layer 360, which minimizes external light that can reach the color conversion layer 330.

In the case of FIG. 1, according to an embodiment, the first light blocking member 320 is positioned between the first color filter 325R and the second color filter 325G, between the second color filter 325G and the third color filter 325B, and between the third color filter 325B and the first color filter 325R, however it may be positioned only between some color filters of the color filter layer 325. For example, the first light blocking member 320 may only be positioned between the first color filter 325R and the second color filter 325G. The first light blocking member 320 may be positioned between the color conversion layers 330, and may be dually positioned between the color filter layers 325 and between the color conversion layers 330. The height of the first light blocking member 320 may also be higher than the height of the color filter layer 325, unlike in FIG. 1.

In a present exemplary embodiment, the first light blocking layer 360 is positioned under the color filter layer 325, however it may be positioned under the second substrate 310, and the first light blocking layer 360 is not limited to being adjacent to the color filter layer 325.

The color conversion panel 300 according to a present exemplary embodiment is not limited to the above-described constituent elements, so other constituent elements may be further included, and a positional relationship of each constituent element may be changed.

Next, an exemplary embodiment of FIG. 4 will be described.

Figure 4:
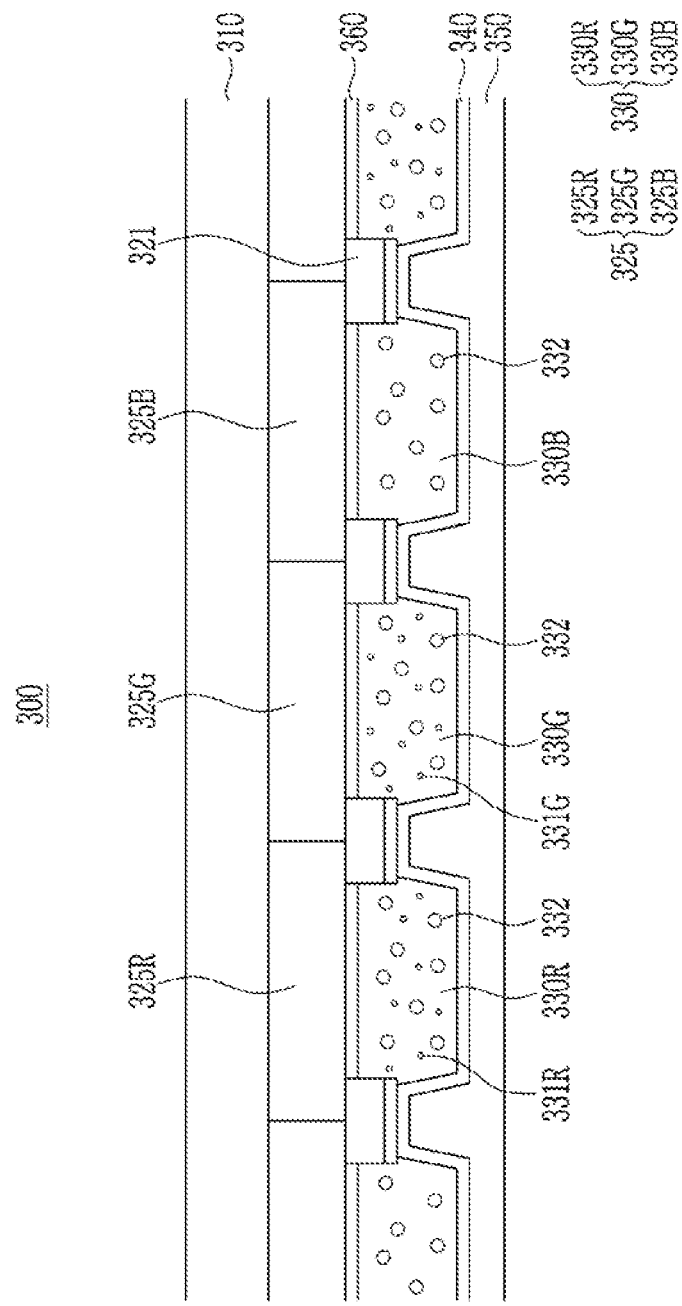
FIG. 4, FIG. 5, and FIG. 6 are cross-sectional views of a color conversion panel according to an exemplary embodiment.

FIG. 4 is a cross-sectional view of a color conversion panel according to an exemplary embodiment.

The color conversion panel 300 according to an exemplary embodiment of FIG. 4, unlike an exemplary embodiment of FIG. 1, includes a second light blocking member 321 positioned under the color filter layer 325 instead of the first light blocking member 320 positioned under the second substrate 310. In the following, a detailed description of the same constituent elements is omitted, and different portions are mainly described.

According to an exemplary embodiment of FIG. 4, since the first light blocking member 320 positioned between the color filter layers 325 is omitted, the first color filter 325R, the second color filter 325G, and the third color filter 325B are adjacent to each other.

According to an embodiment, the second light blocking member 321 has a lattice structure that forms openings with spaces for displaying an image, and is formed of a light blocking material. FIG. 4 is a cross-sectional view that shows the structure in which second light blocking members 321 are separated by a predetermined interval. Referring to FIG. 4, the second light blocking member 321 is positioned between at least one pair of adjacent, different color conversion layers 330, i.e., between the first color conversion layer 330R and the second color conversion layer 330G, between the second color conversion layer 330G and the third color conversion layer 330B, or between the third color conversion layer 330B and the first color conversion layer 330R. That is, the color conversion layer 330 is positioned in the openings of the second light blocking member 321.

According to an embodiment, the first light blocking layer 360 includes a fourth portion that overlaps the second light blocking member 321 and a fifth portion positioned between fourth portions in a plan view. The fourth portion is positioned under the second light blocking member 321 in the cross-sectional view. That is, unlike in FIG. 1, the first light blocking layer 360 includes a plurality of flat fourth portions displaced downward from color filter layers 325 and positioned under the second light blocking member 321, and a plurality of flat fifth portions positioned under the color filter layers 325. In this case, the fourth and fifth portions of the first light blocking layer 360 are connected by the side surfaces of the second light blocking members 321. In addition, the first light blocking layer 360 is positioned under the entire bottom surface of the color filter layer 325.

According to an embodiment, the second light blocking member 321 is adjacent to the color conversion layer 330 to prevent light emitted from the color conversion layer 330 from mixing and to absorb external light and external light that is reflected from the color conversion layer 330. Accordingly, the color conversion panel 300 according to an exemplary embodiment of FIG. 4 minimizes external light incident to the color conversion layer 330 by the first light blocking layer 360, and even if the external light reaches the color conversion layer 330 through the first light blocking layer 360, the external light reflected from the color conversion layer 330 is absorbed by the second light blocking member 321, to minimize the external light that can be recognized by the user.

Unlike in FIG. 4, the second light blocking member 321 may only be positioned between some of the color conversion layers 330. As an example, the second light blocking member 321 may be positioned between only the first color conversion layer 330R and the second color conversion layer 330G. The height of the second light blocking member 321 is not limited to being lower than the height of the color conversion layer 330, and may be higher than the color conversion layer 330, unlike in FIG. 4.

Figure 5:
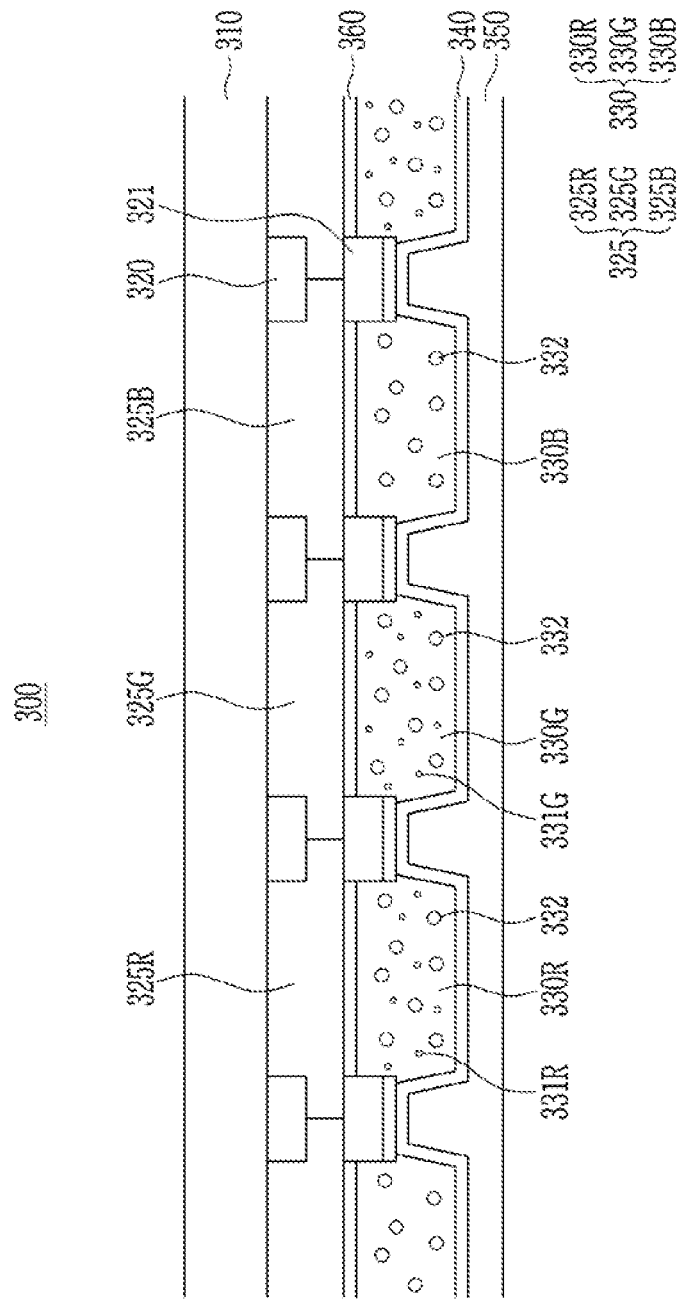

A color conversion panel according to an exemplary embodiment of the present disclosure will now be described with reference to FIG. 5. The color conversion panel 300 according to an exemplary embodiment of FIG. 5 is similar to the color conversion panel 300 according to an exemplary embodiment of FIG. 1 and FIG. 4, except that it includes both the first light blocking member 320 and the second light blocking member 321. A detailed description of the same constituent elements is omitted.

The color conversion panel 300 according to an exemplary embodiment of FIG. 5 includes both of the first light blocking member 320 positioned under the second substrate 310 and the second light blocking member 321 positioned under the color filter layer 325. The first light blocking member 320 and the second light blocking member 321 correspond to the light blocking members 320 and 321 that prevent color mixing.

Referring to FIG. 5, according to an embodiment, the first light blocking member 320 is positioned between at least one pair of adjacent, different color filters 325, i.e., between the first color filter 325R and the second color filter 325G, between the second color filter 325G and the third color filter 325B, or between the third color filter 325B and the first color filter 325R. The second light blocking member 321 is positioned between at least one pair of adjacent, different color conversion layers 330, i.e., between the first color conversion layer 330R and the second color conversion layer 330G, between the second color conversion layer 330G and the third color conversion layer 330B, or between the third color conversion layer 330B and the first color conversion layer 330R.

According to an embodiment, FIG. 5 shows that the first light blocking members 320 overlap the second light blocking members 321, however they need not overlap.

According to an embodiment, the both light blocking members 320 and 321 are positioned under the second substrate 310 and the color filter layer 325, thereby preventing color mixing of light emitted from the color conversion layer 330, and further effectively absorbing externally incident light or external light reflected from the quantum dots 331R and 331G and the scatterers 332.

Hereinafter, a color conversion panel according to an exemplary embodiment of the present disclosure will be described with reference to FIG. 6, FIG. 7, and FIG. 8. The color conversion panel 300 according to an exemplary embodiment of FIG. 6 includes a second light blocking layer 361 instead of the first light blocking layer 360, unlike in FIG. 1. An exemplary embodiment of FIG. 6 includes the first light blocking member 320, and the description thereof is the same as that described for an exemplary embodiment of FIG. 1.

According to an embodiment, the second light blocking layer 361 is positioned under the second substrate 310. The second light blocking layer 361 is flat, and is positioned on the whole upper surface of the color filter layer 325. The second light blocking layer 321 includes a first portion that overlaps the first color filter, a second portion that overlaps the second color filter, and a third portion that overlaps the third color filter. The first portion, the second portion, and the third portion are connected According to an embodiment, the refractive index of the second light blocking layer 361 may be less than the refractive index of an adjacent constituent element of the color conversion panel 300. In an exemplary embodiment of FIG. 6, the refractive index of the second light blocking layer 361 is less than the refractive index of the color filter layer 325. For example, the refractive index of the second light blocking layer 361 may be from 1.2 to 1.5.

On the other hand, according to an embodiment, the refractive index of the second light blocking layer 361 may be greater than the refractive index of an adjacent element of the color conversion panel 300. In an exemplary embodiment of FIG. 6, the refractive index of the second light blocking layer 361 is greater than the refractive index of the second substrate 310. For example, the refractive index of the second light blocking layer 361 may be from 1.9 to 2.1. The second light blocking layer 361 may include an transparent conductive layer, such as ITO, IZO, etc., or an inorganic insulating layer that includes a nitride layer that includes SiNx, etc.

According to an embodiment, when the refractive index of the second light blocking layer 361 exceeds 1.5 and is less than 1.9, because of differences between refractive indices for the adjacent layers, the color conversion panel 300 may have unexpected effects, and when the refractive index of the first light blocking layer 360 exceeds 2.1 or is less than 1.2, the path of the light emitted from the display device is affected, which can reduce the light emission efficiency of the display device.

However, according to an embodiment, since the second light blocking layer 361 has either a high refractive index, i.e., a refractive index of 1.9 to 2.1, or a low refractive index, i.e., a refractive index of 1.2 to 1.5, external light incident to the color conversion panel 300 can be prevented from being incident to the color conversion layer 330 and light emission efficiency can be increased.

Next, light characteristics of the second light blocking layer 361 will be described in detail with reference to FIG. 7 and FIG. 8. Hereinafter, a green pixel is mainly described, however the description is applicable to the second light blocking layer 361 positioned at the red and blue pixels.

Figure 6:
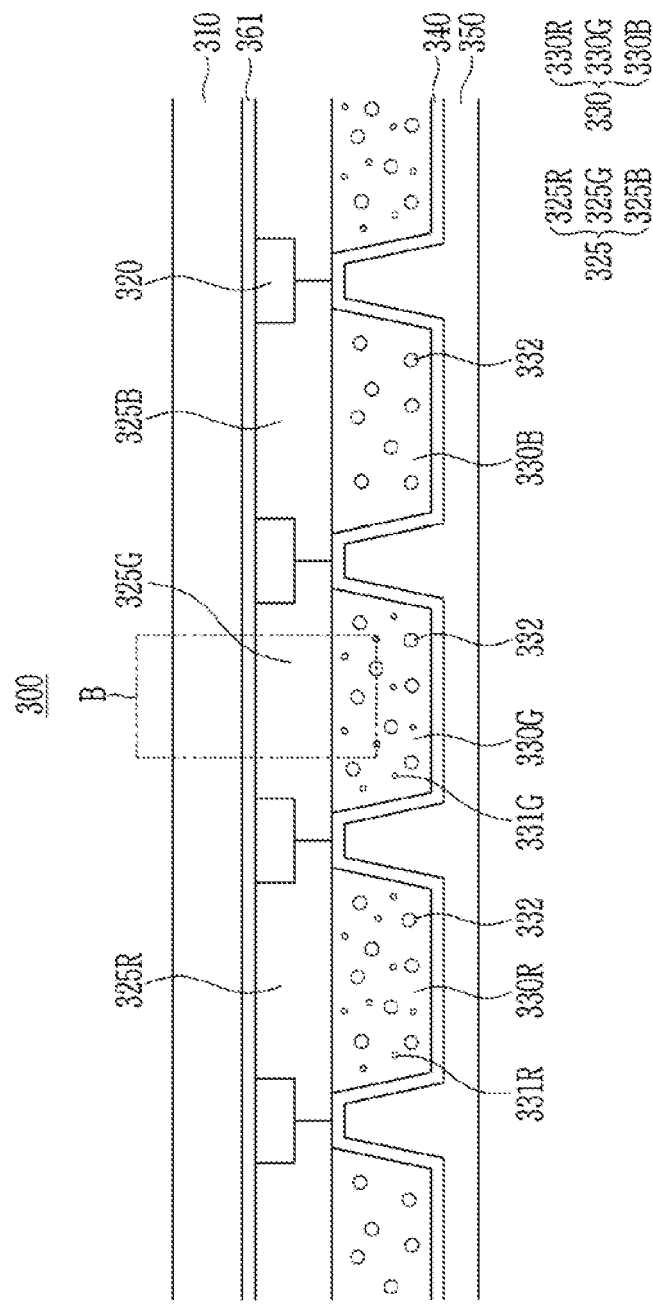
Figure 7:
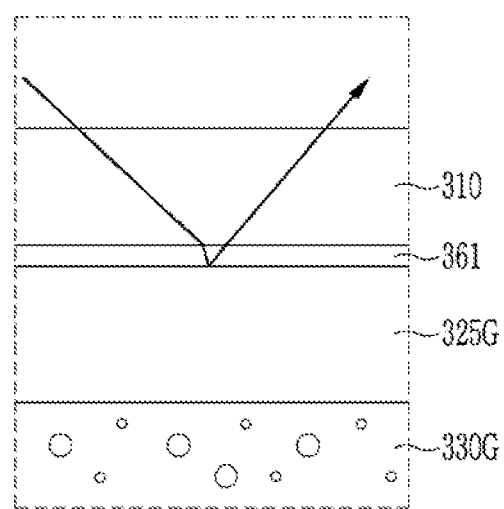
FIG. 7 and FIG. 8 are enlarged views showing a portion B of a color conversion panel of FIG. 6.
Figure 8:
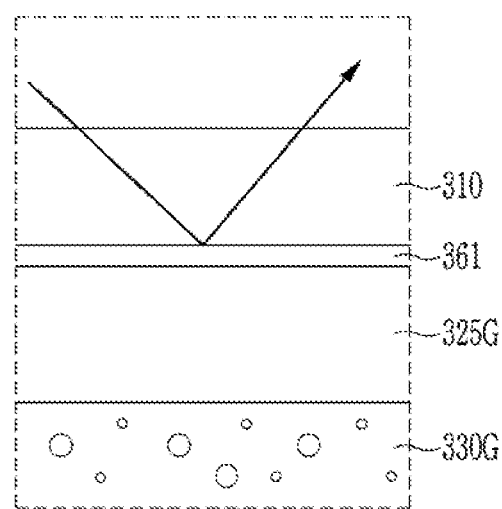

FIG. 7 and FIG. 8 are enlarged views of a portion B of the color conversion panel 300 of FIG. 6, and FIG. 7 is first described.

FIG. 7 is the enlarged view of be portion B of the color conversion panel 300 of FIG. 6 when the second light blocking layer 361 has a low refractive index, a refractive index of 1.2 to 1.5.

According to an embodiment, the refractive index of the second color filter 325G is greater than the refractive index of the second light blocking layer 361. Accordingly, external light is incident through the second substrate 310 to the lower refractive index second light blocking layer 361 rather than the second color filter 325G, and then is reflected back without being incident into the second color filter 325G by the difference between the refractive indices of the second light blocking layer 361 and the second color filter 325G.

FIG. 8 is the enlarged view of the portion B of the color conversion panel 300 of FIG. 6 when the second light blocking layer 361 has a high refractive index, i.e., a refractive index of 1.9 to 2.1.

According to an embodiment, the refractive index of the second light blocking layer 361 is greater than the refractive index of the second substrate 310. Accordingly, the external light is reflected back without being incident into the second color filter 325G by the difference between the refractive indices of the second substrate 310 and the second light blocking layer 361 after passing through the second substrate 310.

As described above, according to an embodiment, the color conversion panel 300 according to an exemplary embodiment of FIG. 6 includes the second substrate 310, the color filter layer 325 and a low refractive index or a high refractive index second light blocking layer 361, which can minimize external light that reaches the color conversion layer 330.

In a present exemplary embodiment, the second light blocking layer 361 is positioned under the second substrate 310, however it may be positioned under the color filter layer 325, and the second light blocking layer 361 is not limited to being adjacent to the second substrate 310.

Hereinafter, a color conversion panel according to an exemplary embodiment of the present invention will be described with reference to FIG. 9.

Figure 9:
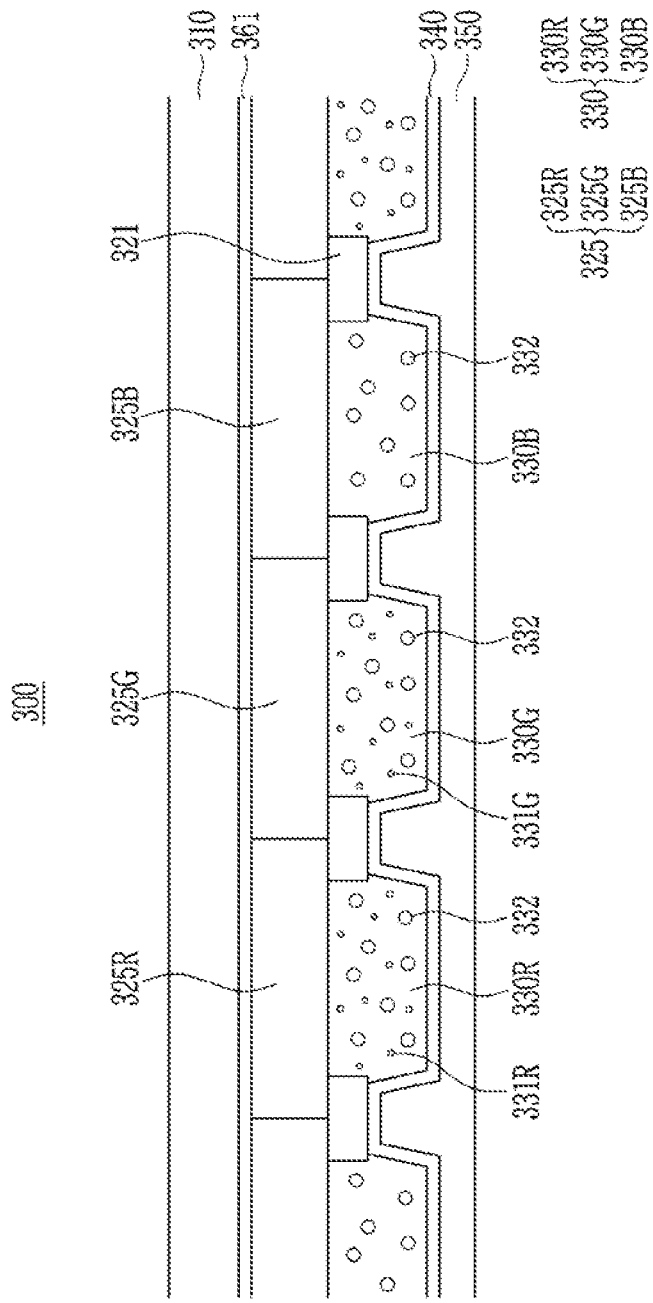
FIG. 9 to FIG. 17 are cross-sectional views of a color conversion panel according to an exemplary embodiment.

Unlike an exemplary embodiment of FIG. 6, the color conversion panel 300 according to an exemplary embodiment of FIG. 9 includes the second light blocking member 321 positioned under the color filter layer 325 instead of the first light blocking member 320 positioned under the second substrate 310. A detailed description of the same constituent elements is omitted.

According to an embodiment, the second light blocking member 321 is positioned between at least one pair of adjacent, different color conversion layers 330, i.e., between the first color conversion layer 330R and the second color conversion layer 330G, between the second color conversion layer 330G and the third color conversion layer 330B, or between the third color conversion layer 330B and the first color conversion layer 330R. A detailed description of the second light blocking member 321 is the same as that of the second light blocking member 321 of the exemplary embodiment of FIG. 4.

Figure 10:
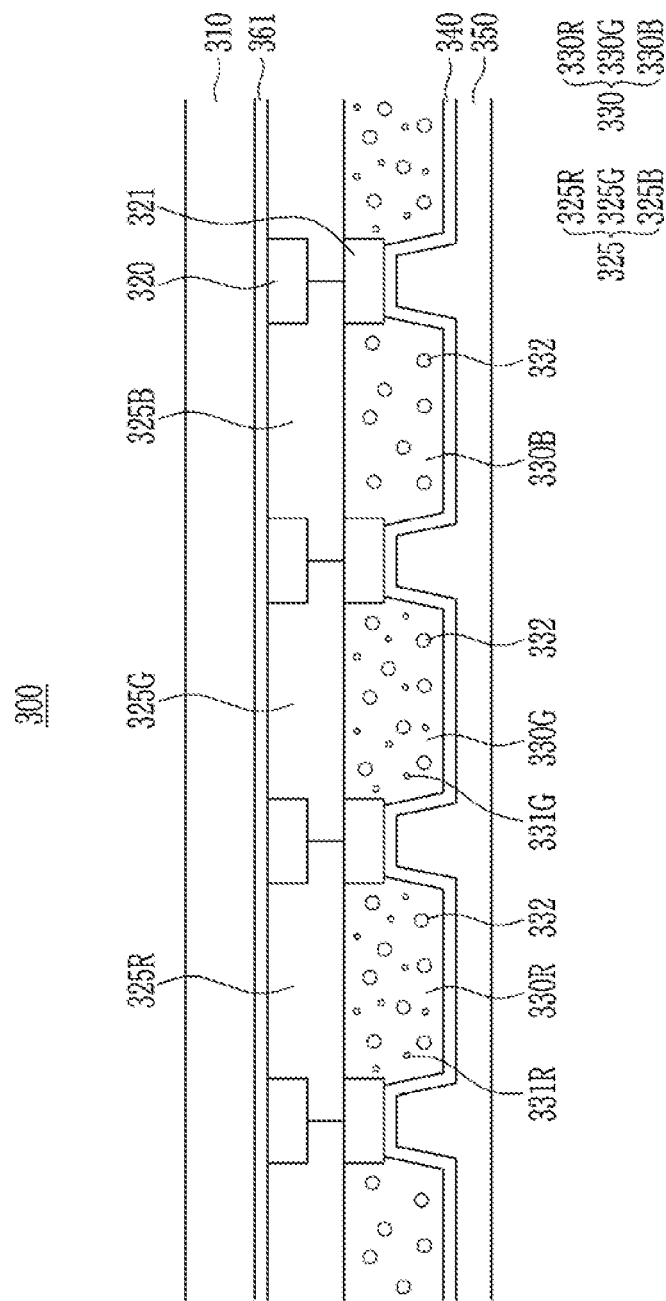

A color conversion panel according to an exemplary embodiment of the present disclosure will now be described with reference to FIG. 10. The color conversion panel 300 according to an exemplary embodiment of FIG. 10 is similar to the color conversion panel 300 according to exemplary embodiments of FIG. 6 and FIG. 9 except for including the first light blocking member 320 and the second light blocking member 321. A detailed description of the same constituent elements is omitted.

The color conversion panel 300 according to an exemplary embodiment of FIG. 10 includes both the first light blocking member 320 positioned under the second substrate 310 and the second light blocking member 321 positioned under the color filter layer 325. The first light blocking member 320 is positioned between at least one pair of adjacent, different color filter layers 325, i.e., between the first color filter 325R and the second color filter 325G, between the second color filter 325G and the third color filter 325B, or between the third color filter 325B and the first color filter 325R. The second light blocking member 321 is positioned between at least one pair of adjacent, different color conversion layers 330, i.e., between the first color conversion layer 330R and the second color conversion layer 330G, between the second color conversion layer 330G and the third color conversion layer 330B, or between the third color conversion layer 330B and the first color conversion layer 330R. A detailed description of the light blocking members 320 and 321 is the same as that of the exemplary embodiment of FIG. 5.

A color conversion panel according to an exemplary embodiment of the present invention will now be described with reference to FIG. 11. Unlike exemplary embodiments of FIG. 1 and FIG. 6, the color conversion panel 300 according to an exemplary embodiment of FIG. 11 includes both the first light blocking layer 360 positioned between the color filter layer 325 and the color conversion layer 330 and the second light blocking layer 361 positioned between the second substrate 310 and the color filter layer 325. The first light blocking layer 360 is substantially flat and is positioned under the whole bottom surface of the color filter layer 325. The second light blocking layer 361 is substantially flat and is positioned on the whole upper surface of the color filter layer 325.

Figure 11:
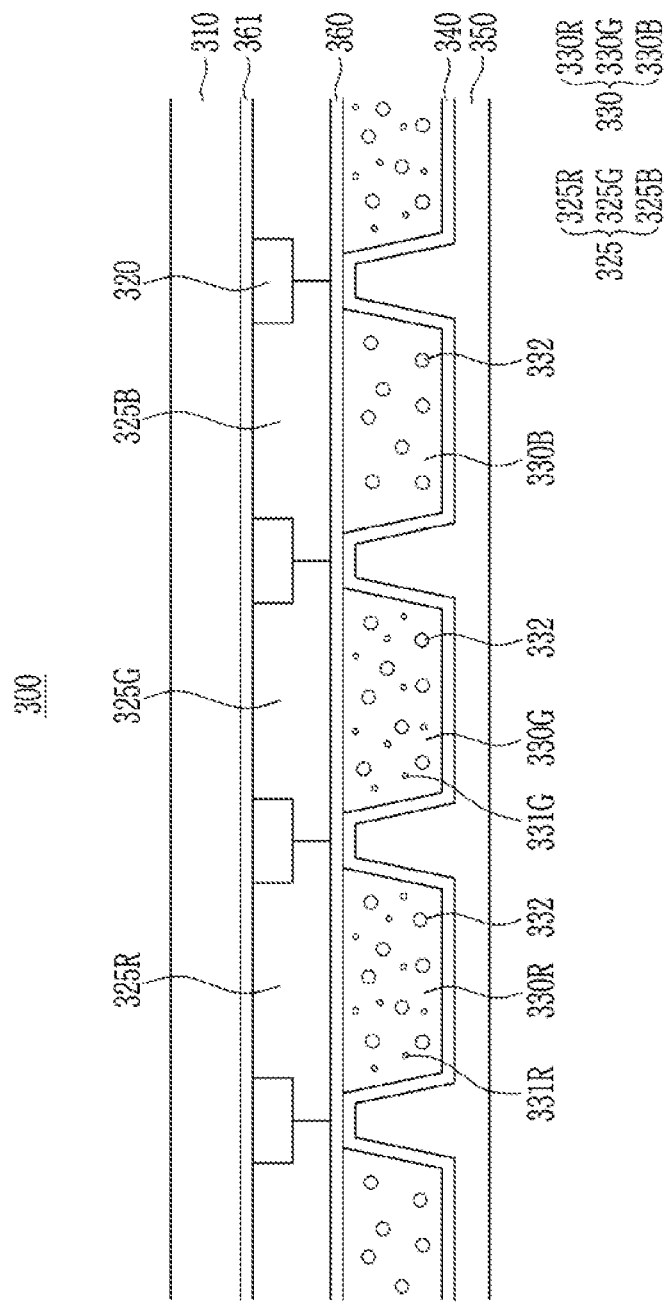

An exemplary embodiment of FIG. 11 includes the first light blocking member 320, and a description thereof is the same as that described for an exemplary embodiment of FIG. 1.

According to an embodiment, a refractive index of the first light blocking layer 360 or the second light blocking layer 361 is less than the refractive index of an adjacent constituent element of the color conversion panel 300. In a present exemplary embodiment, the refractive index of the first light blocking layer 360 is less than the refractive index of the color conversion layer 330, and the refractive index of the second light blocking layer 361 is less than the refractive index of the color filter layer 325. For example, the refractive index of the first light blocking layer 360 or the second light blocking layer 361 may be from 1.2 to 1.5.

According to an embodiment, a refractive index of the first light blocking layer 360 or the second light blocking layer 361 is greater than the refractive index of an adjacent constituent element of the color conversion panel 300. In a present exemplary embodiment, the refractive index of the first light blocking layer 360 is greater than the refractive index of the color filter layer 325, and the refractive index of the second light blocking layer 361 is greater than the refractive index of the second substrate 310. For example, the refractive index of the first light blocking layer 360 or the second light blocking layer 361 may be from 1.9 to 2.1. The first or second light blocking layers 360 and 361 may include a transparent conductive layer, such as ITO, IZO, etc. or an inorganic insulating material that includes a nitride such as a SiNx, etc.

According to an embodiment, a refractive index of the first light blocking layer 360 differs from that of the second light blocking layer 361. In addition, the first light blocking layer 360 may have the higher refractive index, i.e., a refractive index of 1.9 to 2.1, and the second light blocking layer 361 may have the lower refractive index, i.e., a refractive index of 1.2 to 1.5. In contrast, the first light blocking layer 360 may have the lower refractive index and the second light blocking layer 361 may have the higher refractive index. The detailed effect of the first and second light blocking layers 360 and 361 is the same as described above.

Figure 12:
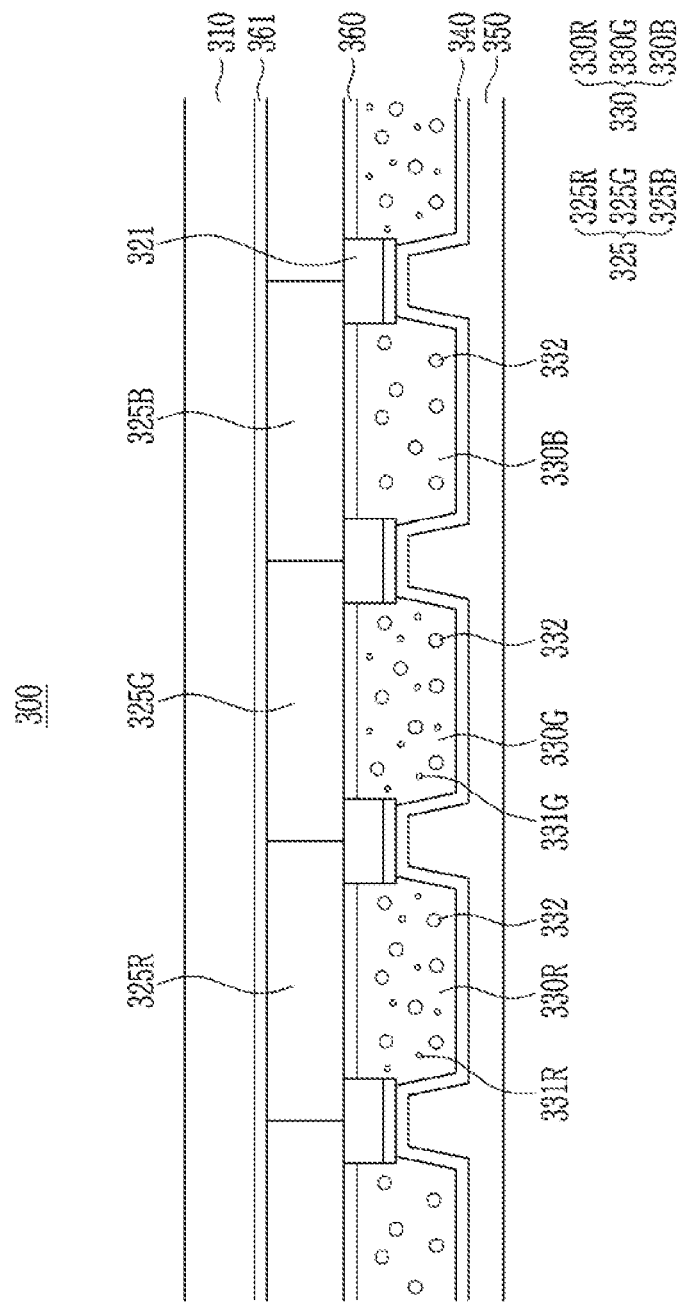

A color conversion panel according to an exemplary embodiment of the present invention will now be described with reference to FIG. 12. Unlike an exemplary embodiment of FIG. 11, the color conversion panel 300 according to an exemplary embodiment of FIG. 12 includes the second light blocking members 321 positioned under the color filter layer 325 instead of the first light blocking members 320 positioned under the second substrate 310. A detailed description of the same constituent elements is omitted.

According to an embodiment, the second light blocking member 321 is positioned between at least one pair of adjacent, different color conversion layers 330, i.e., between the first color conversion layer 330R and the second color conversion layer 330G, between the second color conversion layer 330G and the third color conversion layer 330B, or between the third color conversion layer 330B and the first color conversion layer 330R. A description of the second light blocking member 321 is the same as that of an exemplary embodiment of FIG. 4.

Figure 13:
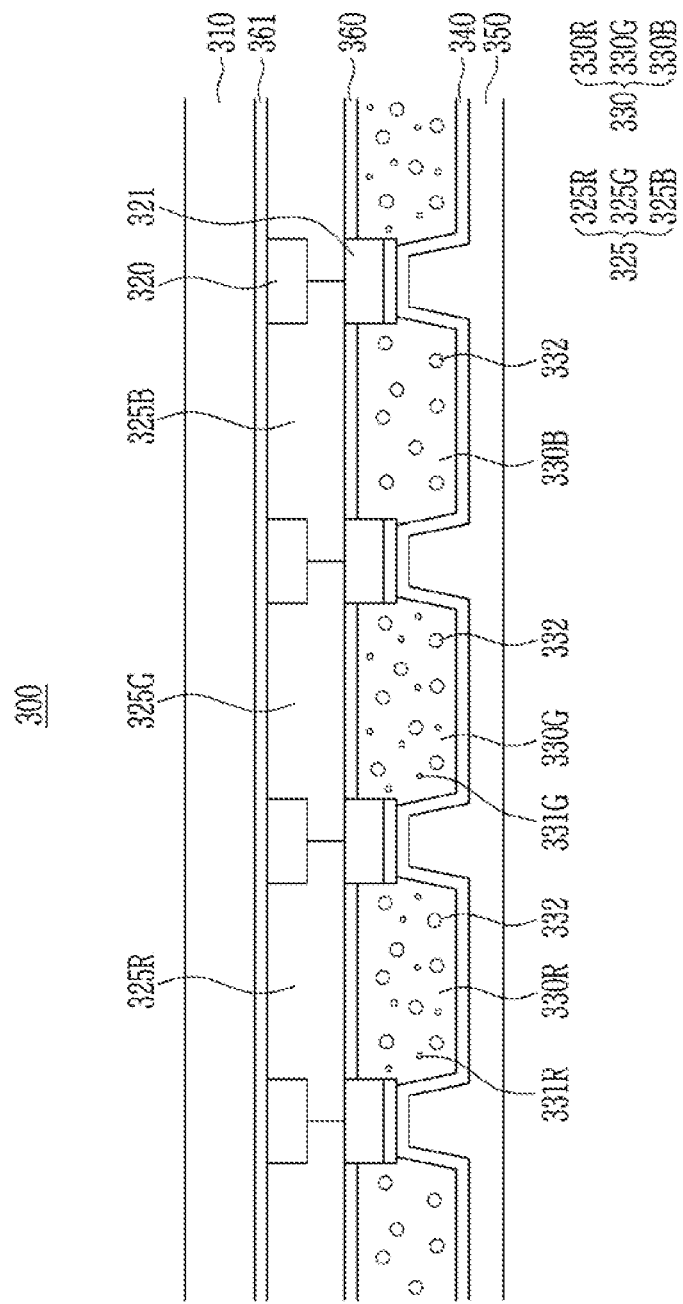

A color conversion panel according to an exemplary embodiment of the present invention will now be described with reference to FIG. 13. The color conversion panel 300 according to an exemplary embodiment of FIG. 13 is similar to the color conversion panel 300 according to an exemplary embodiment of FIG. 11 and FIG. 12, except for including both the first light blocking members 320 and the second light blocking members 321. A detailed description of the same constituent elements is omitted.

According to an embodiment, the first light blocking members 320 are positioned under the second substrate 310, and the second light blocking members 321 are positioned under the color filter layer 325. The first light blocking member 320 is positioned between at least one pair of adjacent, different color filters 325, i.e., between the first color filter 325R and the second color filter 325G, between the second color filter 325G and the third color filter 325B, or between the third color filter 325B and the first color filter 325R. The second light blocking member 321 is positioned between at least one pair of adjacent, different color conversion layers 330, i.e., between the first color conversion layer 330R and the second color conversion layer 330G, between the second color conversion layer 330G and the third color conversion layer 330B, or between the third color conversion layer 330B and the first color conversion layer 330R.

A detailed description of the light blocking members 320 and 321 is the same as that of the exemplary embodiment of FIG. 5 and is omitted.

A color conversion panel according to another exemplary embodiment of the present invention will now be described with reference to FIG. 14.

Figure 14:
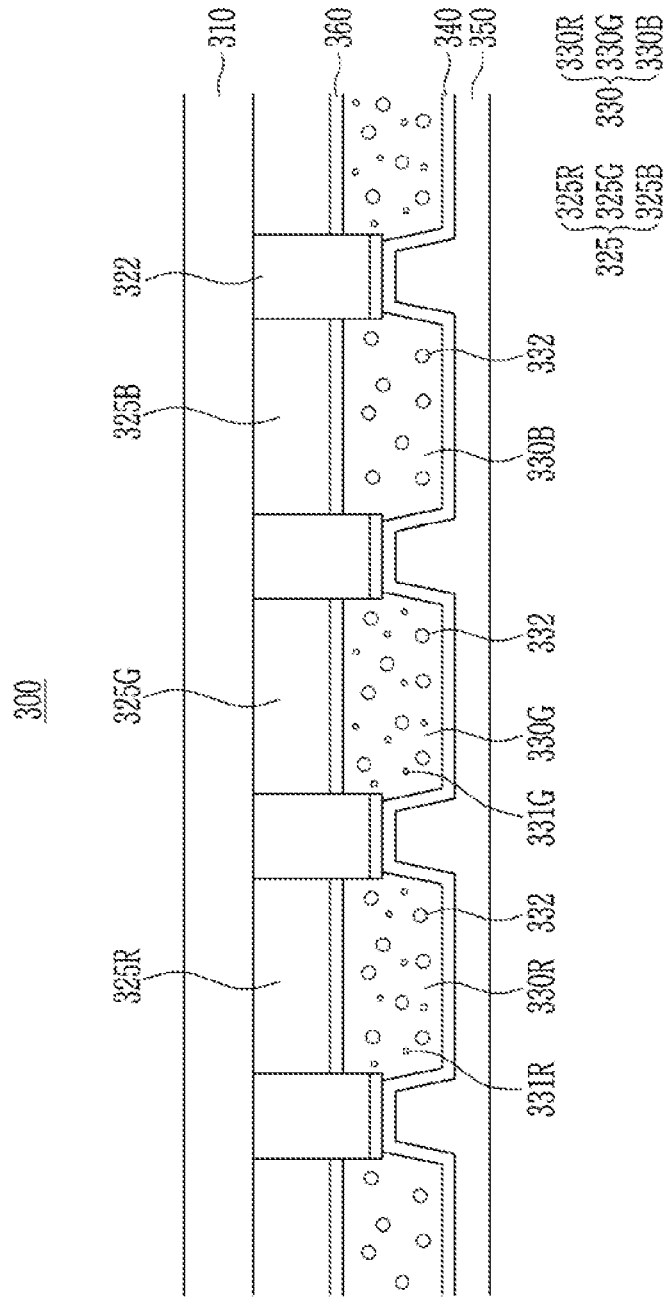

The color conversion panel 300 according to an exemplary embodiment of FIG. 14 includes the first light blocking layer 360 positioned under the color filter layer 325, and a description of the first light blocking layer 360 is the same as that of an exemplary embodiment of FIG. 4 and is omitted.

The color conversion panel 300 according to a present exemplary embodiment includes a third light blocking member 322 positioned under the second substrate 310 and positioned between at least one pair of adjacent, different color filters, i.e., between the first color filter 325R and the second color filter 325G, between the second color filter 325G and the third color filter 325B, or between the third color filter 325B and the first color filter 325R. The height of the third light blocking member 322 in a cross-sectional view may be equal to or higher than the height of the color filter layer 325 in a cross-sectional view.

According to an embodiment, the light blocking member 322 is positioned adjacent to the side surface of the color filter layer 325 and a part of the side surface of the color conversion layer 330, and thus color mixing of the emitted light can be prevented, and externally incident light or external light reflected by the quantum dots 331R and 331G and the scatterers 332 can be further effectively absorbed.

A color conversion panel according to an exemplary embodiment of the present invention will now be described with reference to FIG. 15. Unlike an exemplary embodiment of FIG. 14, the color conversion panel 300 according to an exemplary embodiment of FIG. 15 includes the second light blocking layer 361 instead of the first light blocking layer 360. A description of the same constituent elements is omitted.

Figure 15:
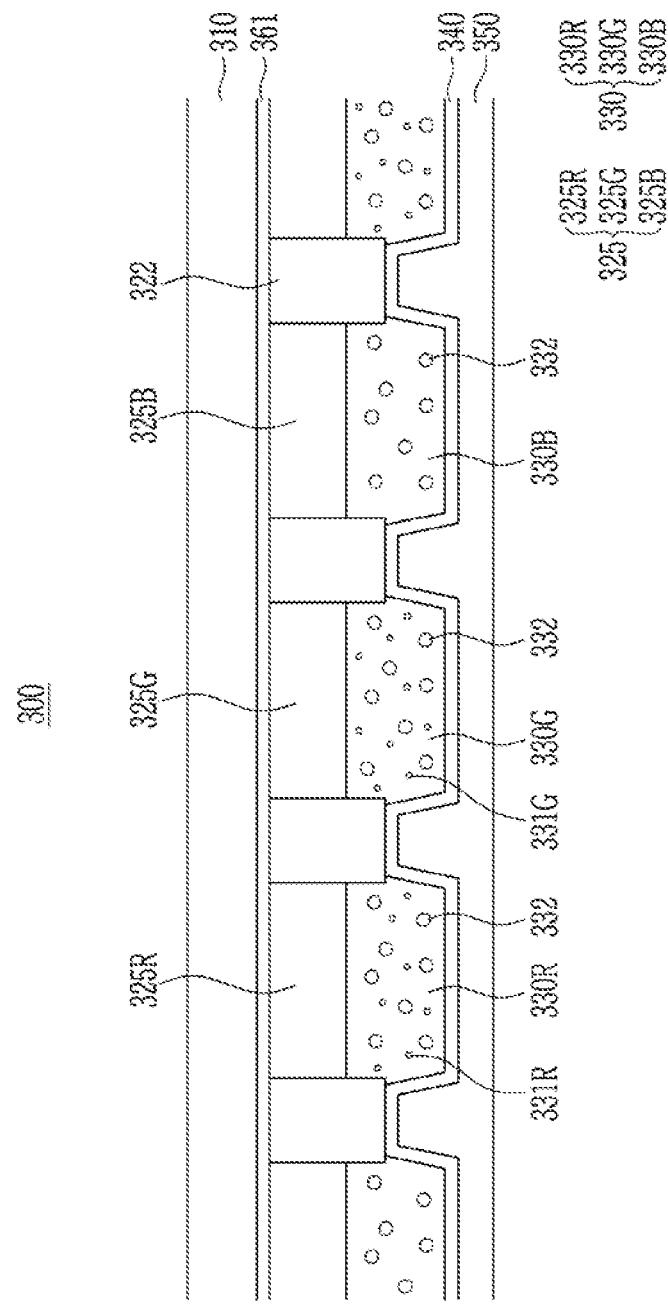

The color conversion panel 300 according to an exemplary embodiment of FIG. 15 includes the second light blocking layer 361 positioned between the second substrate 310 and the color filter layer 325. A description of the second light blocking layer 361 is same as that of an exemplary embodiment of FIG. 6 and is omitted.

A color conversion panel according to an exemplary embodiment of the present invention will now be described with reference to FIG. 16.

Figure 16:
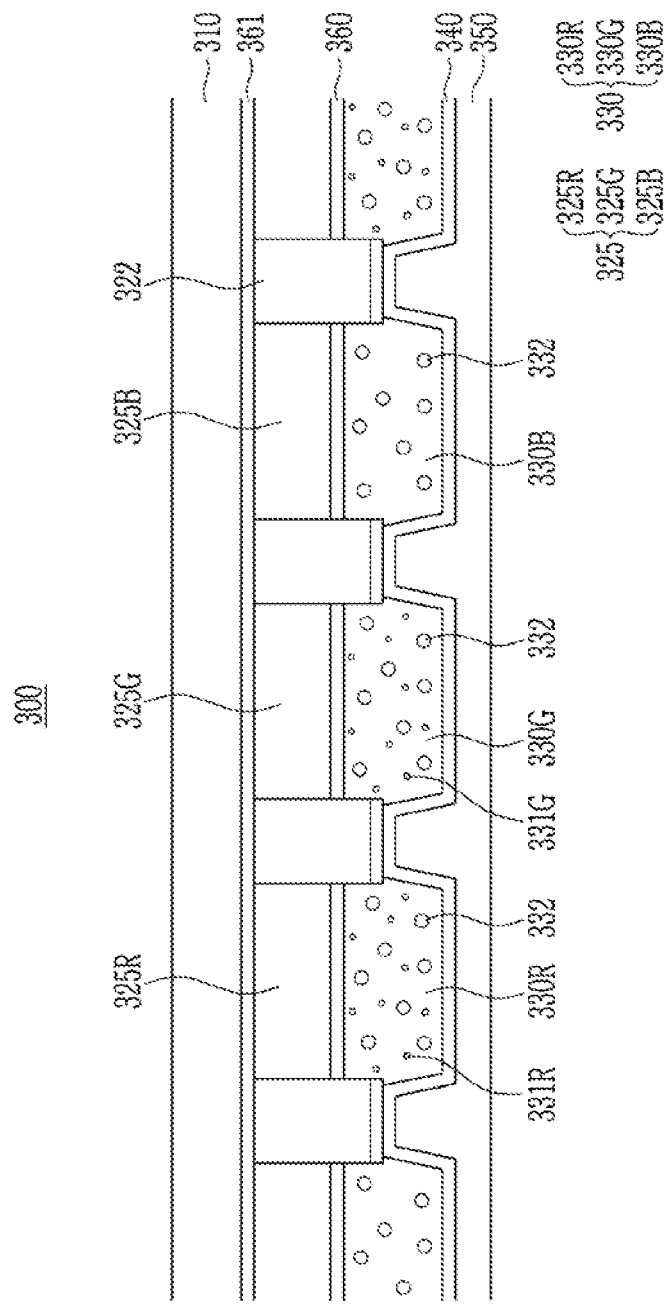

The color conversion panel 300 according to an exemplary embodiment of FIG. 16 includes both the first light blocking layer 360 positioned between the color filter layer 325 and the color conversion layer 330 and the second light blocking layer 361 positioned between the second substrate 310 and the color filter layer 325. A detailed description of the first and second light blocking layers 360 and 361 is the same as that of an exemplary embodiment of FIG. 11.

A color conversion panel according to a exemplary embodiment of the present invention will now be described with reference to FIG. 17, FIG. 18, and FIG. 19.

Figure 17:
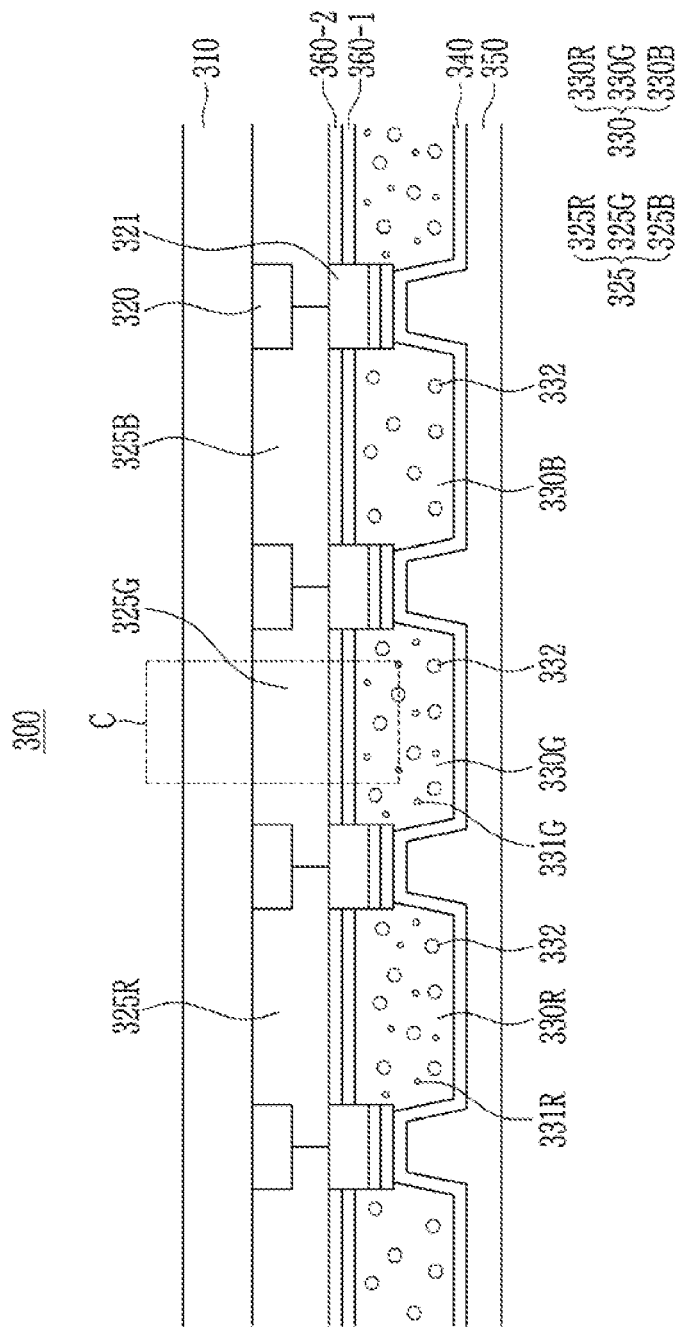

An exemplary embodiment of FIG. 17 is substantially similar to an exemplary embodiment of FIG. 5, except that the first light blocking layer 360 includes a first refraction layer 360-1 and a second refraction layer 360-2.

According to an embodiment, the first light blocking layer 360 includes a fourth portion that overlaps the second light blocking member 321 in a plan view and the fifth portion positioned between the fourth portions. The fourth portion is positioned under the second light blocking member 321 in a cross-sectional view. That is, unlike in FIG. 1, the first light blocking layer 360 is not substantially flat, and parts thereof are positioned under the second light blocking member 321. In this case, the fourth and fifth portions of the first light blocking layer 360 are connected by side surfaces of the second light blocking member 321. In addition, the first light blocking layer 360 is positioned under entire bottom surface of the color filter layer 325.

According to an embodiment, the first light blocking layer 360 includes the first refraction layer 360-1 and the second refraction layer 360-2. The first refraction layer 360-1 has a low refractive index, i.e., a refractive index of 1.2 to 1.5, and the second refraction layer 360-2 has a high refractive index, i.e., a refractive index of 1.9 to 2.1. In contrast, the first refraction layer 360-1 may have a high refractive index, and the second refraction layer 360-2 may have a low refractive index.

Hereinafter, light characteristics of the first refraction layer 360-1 and the second refraction layer 360-2 will be described in detail with reference to FIG. 18 and FIG. 19. Here, a green pixel is mainly described, however this description is applicable to the first light blocking layer 360 positioned in the red or blue pixels.

Figure 18:
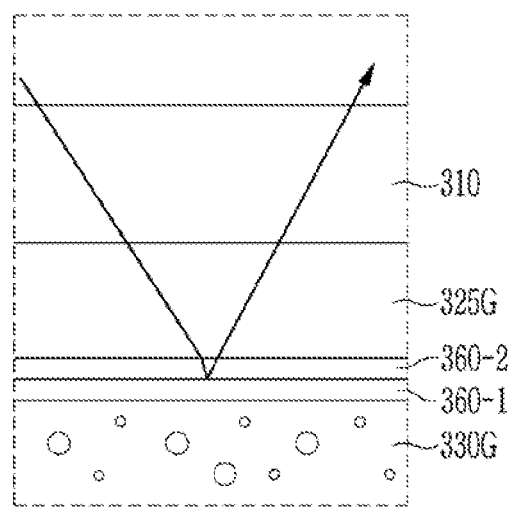
FIG. 18 and FIG. 19 are enlarged views showing a portion C of a color conversion panel of FIG. 17.

According to an embodiment, FIG. 18 is an enlarged view of portion C of the color conversion panel 300 of FIG. 17 when the first refraction layer 360-1 has a high refractive index, i.e., a refractive index of 1.9 to 2.1, and the second refraction layer 360-2 has a low refractive index, i.e., a refractive index of 1.2 to 1.5.

Referring to FIG. 18, according to an embodiment, external light is incident to the lower refractive index second refraction layer 360-2 after sequentially passing through the second substrate 310 and the second color filter 325G. The external light is reflected back without being incident to the higher refractive index first refraction layer 360-1 and the second color conversion layer 330G by the differences between the refractive indices of the second refraction layer 360-2 and the first refraction layer 360-1. Accordingly, external light that reaches the second color conversion layer 330G can be minimized.

Figure 19:
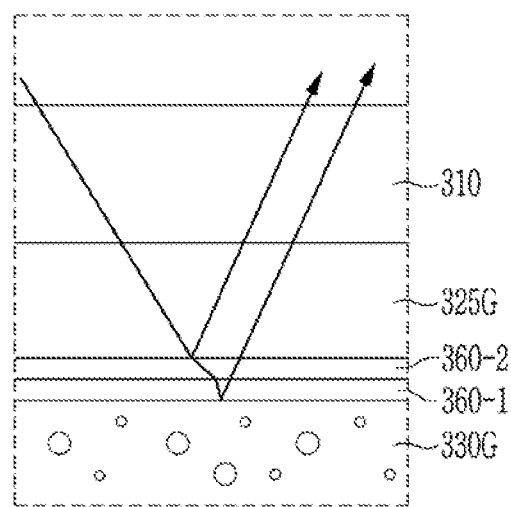

According to an embodiment, FIG. 19 is an enlarged view of portion C of the color conversion panel 300 of FIG. 17 when the first refraction layer 360-1 has a low refractive index, i.e., a refractive index of 1.2 to 1.5, and the second refraction layer 360-2 has a high refractive index. i.e., a refractive index of 1.9 to 2.1. In this case, the refractive index of the second refraction layer 360-2 is greater than the refractive index of the second color filter 325G.

According to an embodiment, externally incident light is reflected back without being incident to the second refraction layer 360-2 by the differences between the refractive indices of the second color filter 325G and the second refraction layer 360-2 after sequentially passing through the second substrate 310 and the second color filter 325G.

In a present exemplary embodiment, the refractive index of the first refraction layer 360-1 is less than the refractive index of the second color conversion layer 330G. As a result, even if externally incident light passes through the second refraction layer 360-2, the light is reflected back by the differences between the refractive index of the first refraction layer 360-1 and the second color conversion layer 330G without being incident to the second color conversion layer 330G. Accordingly, external light that reaches the second color conversion layer 330G can be minimized.

An embodiment according to FIG. 17, includes both the first light blocking member 320 and the second light blocking member 321, however in other embodiments, only the first light blocking member 320 or the second light blocking member 321 are included. In addition, an embodiment of FIG. 17 shows the first light blocking layer 360 as including two layers, however embodiments are not limited thereto, and may include more than two layers having different refractive indexes.

Next, an organic light emitting diode display according to an exemplary embodiment will be described with reference to FIG. 20 and FIG. 21.

First, FIG. 20 will be described.

Figure 20:
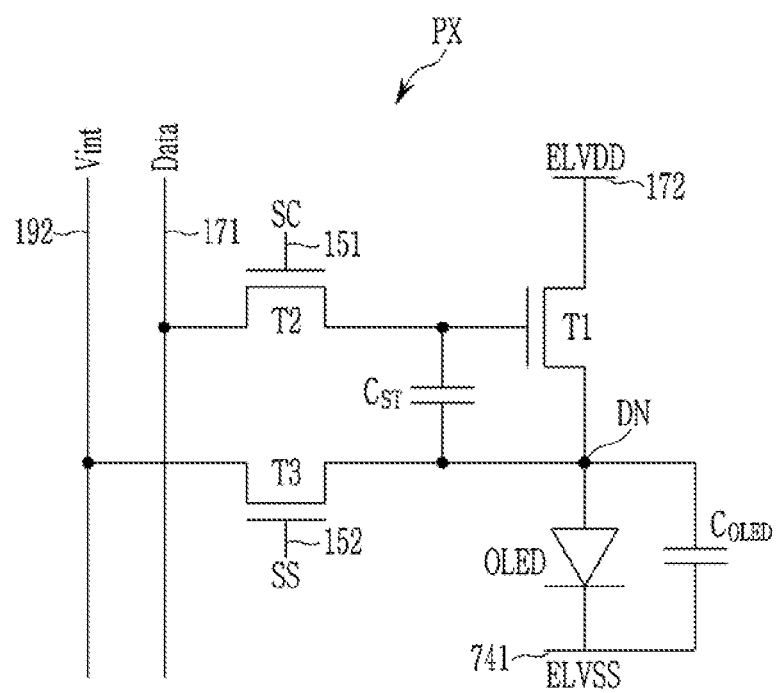
FIG. 20 is an equivalent circuit diagram of one pixel of an organic light emitting diode display according to an exemplary embodiment.

FIG. 20 is an equivalent circuit diagram of one pixel PX of an organic light emitting diode display according to an exemplary embodiment.

Referring to FIG. 20, according to an embodiment, the pixel PX includes a plurality of signal lines 151, 152, 171, 172, and 192, a plurality of transistors T1, T2, and T3, a first storage capacitor $C_{ST}$, a second storage capacitor $C_{OLED}$, and an organic light emitting diode OLED.

According to an embodiment, the transistors T1, T2, and T3 include a driving transistor T1, hereinafter referred to as a first transistor, a second transistor T2, hereinafter referred to as a switching transistor, and a third transistor T3, hereinafter referred to as an initialization transistor.

According to an embodiment, the signal lines 151, 152, 171, 172, and 192 include a scan line 151 that transmits a scan signal SC, an initialization control signal line 152 that transmits an initialization control signal SS, a data line 171 that transmits a data voltage DATA, a driving voltage line 172 that transmits a driving voltage ELVDD, and an initialization voltage line 192 that transmits an initialization voltage Vint.

On the other hand, although an exemplary embodiment of FIG. 20 is shown as including three transistors and two capacitors, embodiments of the present disclosure are not limited thereto, and additional transistors or capacitors may be further included.

According to an embodiment, the driving transistor T1 includes a gate electrode connected to a first electrode of the first storage capacitor $C_{ST}$, a first electrode receiving a driving voltage ELVDD, and a second electrode connected to a first electrode of the organic light emitting diode OLED. The driving transistor T1 outputs a driving current to the organic light emitting diode OLED based on a data signal stored in the first storage capacitor $C_{ST}$. The second electrode of the driving transistor T1 is connected to the third transistor T3, the second electrode of the first storage capacitor $C_{ST}$, and the first electrode of the second storage capacitor $C_{OLED}$.

According to an embodiment, the second transistor T2 includes a gate electrode connected to the scan line 151, a first electrode connected to the data line 171, and a second electrode connected to the first electrode of the first storage capacitor. $C_{ST}$. The second electrode of the second transistor T2 is also connected to the gate electrode of the driving transistor T1. The second transistor T2 is turned on in response to the scan signal SC received through the scan line 151, and when the switching transistor T2 is turned on, the data voltage DATA received through the data line 171 is transmitted to the first electrode of the first storage capacitor $C_{ST}$.

According to an embodiment, the third transistor T3 includes a gate electrode connected to the initialization control signal line 152, a first electrode connected to the initialization voltage line 192, and a second electrode connected to the driving transistor T1. The third transistor T3 is turned on in response to the initialization control signal SS and outputs the initialization voltage Vint, thereby initializing the second electrode of the first storage capacitor $C_{ST}$, the first electrode of the organic light emitting diode OLED, and the first electrode of the second storage capacitor $C_{OLED}$. A node connected to the second electrode of the third transistor T3, the second electrode of the first storage capacitor $C_{ST}$, the first electrode of the organic light emitting diode OLED, the first electrode of the second storage capacitor $C_{OLED}$, and the second electrode of the driving transistor T1 is referred to as an output node DN of the driving transistor T1.

According to an embodiment, the first storage capacitor $C_{ST}$ includes a first electrode connected to the second electrode of the second transistor T2 and the gate electrode of the driving transistor T1, and a second electrode connected to the output node DN of the driving transistor T1. The first storage capacitor $C_{ST}$ stores the data voltage DATA received through the second transistor T2. The data voltage DATA stored in the first storage capacitor $C_{ST}$ controls a degree to which the driving transistor T1 is turned on, thereby determining a magnitude of the driving current.

According to an embodiment, the organic light emitting diode OLED includes a first electrode connected to the second electrode of the driving transistor T1, i.e., the output node DN of the driving transistor T1, and a second electrode connected to a common voltage line 741 that receives a common voltage ELVSS. The organic light emitting diode OLED emits light based on the driving current received from the driving transistor T1, thereby expressing a gray level that depends on the emission intensity.

According to an embodiment, the first electrode and the second electrode of the second storage capacitor $C_{OLED}$ are respectively connected to the first and second electrodes of the organic light emitting diode OLED. The second storage capacitor $C_{OLED}$ allows the voltage transmitted to both ends of the organic light emitting diode OLED to be maintained. That is, since the voltage of the output node DN of the driving transistor T1 is constant respect to the common voltage ELVSS, the emission luminance of the organic light emitting diode OLED is constant.

According to an embodiment, in the pixel PX as shown in FIG. 20, the data voltage DATA that is transmitted when the second transistor T2 is turned on is stored in the first storage capacitor $C_{ST}$ and the driving transistor T1 outputs the driving current based on the data voltage DATA, so that the organic light emitting diode OLED emits light whose luminance corresponds to the driving current. On the other hand, if the third transistor T3 is turned on, the initialization voltage Vint is transmitted to the output node DN of the driving transistor T1, so that the first electrode of the organic light emitting diode OLED, the first electrode of the second storage capacitor $C_{OLED}$, and the second electrode of the first storage capacitor $C_{ST}$ are initialized, and resultantly, the organic light emitting diode OLED does not emit light.

Next, a display device according to an exemplary embodiment will be described with reference to FIG. 21. FIG. 21 is a cross-sectional view of an organic light emitting diode display that includes a color conversion panel according to an exemplary embodiment.

An organic light emitting diode display according to an exemplary embodiment includes a display panel 100 and the color conversion panel 300. The color conversion panel 300 is substantially the same as the color conversion panel 300 described with reference to FIG. 5, and a description thereof is omitted.

The display panel 100 according to an exemplary embodiment includes a first substrate 110. The first substrate 110 is an insulation substrate made of glass, quartz, a ceramic material, or a plastic material.

According to an embodiment, a buffer layer 120 is positioned on the first substrate 110. The buffer layer 120 includes silicon nitride (SiNx) or silicon oxide ($SiO_x$).

According to an embodiment, a semiconductor layer 130 is positioned on the buffer layer 120. The semiconductor layer 130 is made of polysilicon or an oxide semiconductor.

According to an embodiment, when the semiconductor layer 130 is made of an oxide semiconductor, a separate passivation layer is added to protect the oxide semiconductor, which is vulnerable to external environmental factors, such as a high temperature.

According to an embodiment, the semiconductor layer 130 includes a channel region 131 that is channel-doped with an N-type impurity or a P-type impurity, and a source electrode 136 and a drain electrode 137 formed at respective sides of the channel region 131 and that have a higher doping concentration than that of the doping impurity doped in the channel region 131.

According to an embodiment, the buffer layer 120 is positioned between the first substrate 110 and the semiconductor layer 130 to improve characteristics of the polycrystalline silicon and to reduce stress applied to the semiconductor layer 130 on the buffer 120 by blocking impurities from the substrate 110 and flattening the first substrate 110 during a crystallization process that forms the polycrystalline silicon.

According to an embodiment, a gate insulating layer 140 that covers the semiconductor layer 130 is positioned thereon. A gate electrode 155 is positioned on the gate insulating layer 140, and the gate electrode 155 has multiple layers in which metal layers that include one of copper (Cu), a copper alloy, aluminum (Al), an aluminum alloy, molybdenum (Mo), or a molybdenum alloy, is stacked.

According to an embodiment, an interlayer insulating layer 160 is positioned on the gate electrode 155 and the gate insulating layer 140. The interlayer insulating layer 160 includes silicon nitride (SiNx) or silicon oxide ($SiO_x$), etc.

According to an embodiment, the interlayer insulating layer 160 has an opening 66 that exposes the drain electrode 137. Data wires (171 and 179) that include data lines 171 and connecting members 179 are positioned on the interlayer insulating layer 160. The data wires (171 and 179) have multiple layers in which metal layers that include one of copper (Cu), a copper alloy, aluminum (Al), an aluminum alloy, molybdenum (Mo), or a molybdenum alloy is stacked, and, for example, may be formed as a triple layer of titanium/aluminum/titanium (Ti/Al/Ti), a triple layer of molybdenum/aluminum/molybdenum (Mo/Al/Mo), or a triple layer of molybdenum/copper/molybdenum (Mo/Cu/Mo).

According to an embodiment, a passivation layer 180 is positioned on the data wires (171 and 179) and the interlayer insulating layer 160. The passivation layer 180 covers the data wires (171 and 179) to flatten them. The passivation layer 180 is formed of stacked layers of an organic material such as a polyacrylate resin, a polyimide resin, or the like, or of stacked layers of an organic material and an inorganic material.

According to an embodiment, the pixel electrode 191 is positioned on the passivation layer 180. The connecting members 179 are connected to the pixel electrode 191 through openings 81 formed in the passivation layer 180.

According to an embodiment, a partition wall 450 that covers the passivation layer 180 and the pixel electrode 191 is positioned thereon, and the partition wall 450 has a pixel opening 451 that exposes the pixel electrode 191. The partition wall 450 is made of organic materials such as a polyacrylate resin, a polyimide resin, etc., or silica-based inorganic materials.

According to an embodiment, an emission layer 470 is positioned on the pixel electrode 191 exposed by the pixel opening 451, and a common electrode 270 is positioned on the organic emission layer 470. The common electrode 270 is positioned on the plurality of pixels PX. The pixel electrode 191, the emission layer 470, and the common electrode 270 form the organic light emitting diode OLED.

Here, according to an embodiment, the pixel electrode 191 is an anode, which is a hole injection electrode, and the common electrode 270 is a cathode, which is an electron injection electrode. However, embodiments of the present invention are not limited thereto, and depending on a driving method of the organic light emitting diode display, the pixel electrode 191 may be the cathode and the common electrode 270 may be the anode. Holes and electrons are respectively injected from the pixel electrode 191 and the common electrode 270 into the organic emission layer 470, and light is emitted when excitons, which are combinations of the injected holes and electrons, decay from an excited state to a ground state.

According to an embodiment, the emission layer 470 may be made of a low molecular weight organic material or a high molecular weight organic material such as poly(3,4-ethylenedioxythiophene) (PEDOT), etc. Further, the emission layer 470 has multiple layers which include at least one of a light emitting layer, a hole injection layer (HIL), a hole transporting layer (HTL), an electron transporting layer (ETL), or an electron-injection layer (EIL).

The emission layer 470 of an organic light emitting diode display according to a present exemplary embodiment emits blue light. In general, the emission layer 470 of an organic light emitting diode display includes all materials needed for emitting a primary color such as red, green, and blue. However, an organic light emitting diode display according to a present exemplary embodiment uses the color conversion panel 300 positioned on the upper surface of the organic light emitting diode display to emit colors such as red, green, and blue, and accordingly the emission layer 470 includes only the material that generates blue light.

Figure 21:
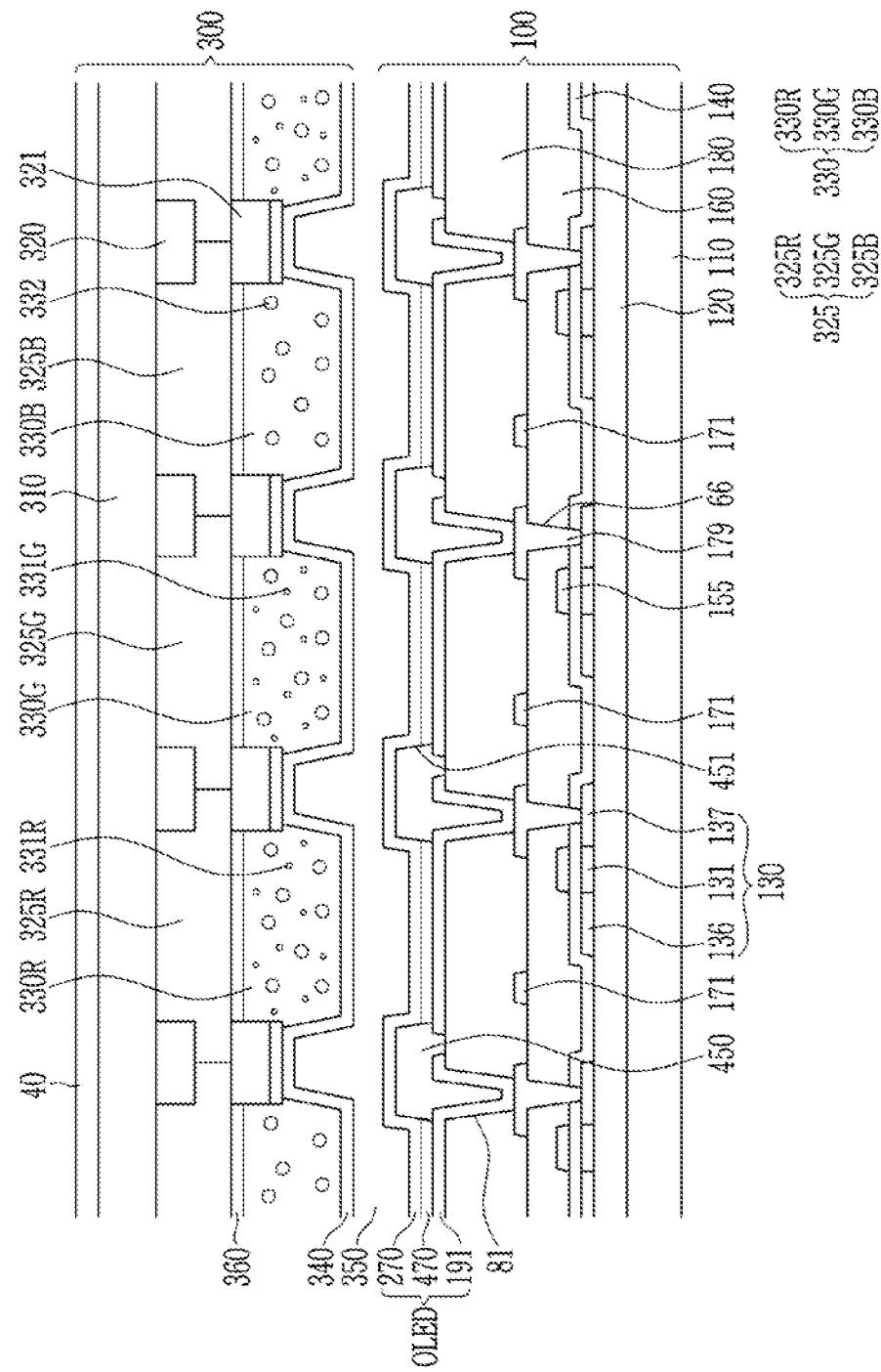
FIG. 21 is a cross-sectional view of an organic light emitting diode display that includes a color conversion panel according to an exemplary embodiment.

An embodiment of FIG. 21 shows the emission layers 470 as separated from each other for each pixel, however embodiments are not limited thereto, and emission layers 470 for adjacent pixels may be connected to each other. For example, the emission layer positioned at the region that emits red light, the emission layer positioned at the region that emits green light and the emission layer positioned at the region that emits blue light can be connected to each other.

The color conversion panel 300 of an organic light emitting diode display according to an exemplary embodiment includes a reflection preventing layer 40. The reflection preventing layer 40 is positioned on the second substrate 310, and scatters external light through surface protrusions and depressions and prevents external light from being recognized by the user through offsetting interference. In addition, the reflection preventing layer 40 includes a structure in which a low refraction layer and a high refraction layer are alternately stacked, or a nanostructure. The reflection preventing layer 40 according to an embodiment is not limited thereto, and may include any structure that can prevent reflection due to differences between the refractive indices of the second substrate 310 and air.

In an exemplary embodiment, the light emission efficiency can be increased, and phenomena such as a blurring phenomenon, a diffraction phenomenon, etc., be reduced, thereby providing an organic light emitting diode display with improved display quality. Also, the color conversion panel 300 may be replaced with any one of those described with respect to FIG. 1, FIG. 4, FIG. 6, and FIG. 9 to FIG. 17.

While embodiments of the disclosure have been described in connection with what is presently considered to be practical exemplary embodiments, it is to be understood that embodiments of the disclosure are not limited to the disclosed embodiments, but, on the contrary, are intended to cover various modifications and equivalent arrangements included within the spirit and scope of the appended claims.

What is claimed is:

1. An organic light emitting diode display, comprising:
   a display panel; and
   a color conversion panel disposed on the display panel, wherein the color conversion panel includes:
      a substrate;
      a color filter layer disposed under the substrate;
      a first light blocking layer disposed under the color filter layer; and
      a first color conversion layer, a second color conversion layer, and a third color conversion layer disposed under the first light blocking layer,
      wherein the color filter layer includes a first color filter, a second color filter, and a third color filter,
      the first light blocking layer includes a first portion that overlaps the first color filter, a second portion that overlaps the second color filter, and a third portion that overlaps the third color filter, and
      the first portion, the second portion, and the third portion are extended to one another.

2. The organic light emitting diode display of claim 1, wherein
   the color conversion panel includes a first light blocking member disposed under the substrate and positioned between at least one pair of adjacent, different color filters.

3. The organic light emitting diode display of claim 2, wherein
   the color conversion panel further includes a second light blocking member disposed under the color filter layer and positioned between at least one pair of adjacent, different color conversion layers.

4. The organic light emitting diode display of claim 2, wherein
   a height of the first light blocking member is higher than a height of the first color filter, the second color filter, or the third color filter.

5. The organic light emitting diode display of claim 1, wherein
   the color conversion panel includes a second light blocking member disposed under the color filter layer and positioned between at least one pair of adjacent, different color conversion layers.

6. The organic light emitting diode display of claim 2, wherein
   the color conversion panel further includes a second light blocking layer disposed under the substrate.

7. The organic light emitting diode display of claim 1, wherein
   a refractive index of the first light blocking layer is greater than a refractive index of the first color filter, the second color filter, or the third color filter, and the refractive index of the first light blocking layer ranges from 1.9 to 2.1.

8. The organic light emitting diode display of claim 1, wherein
   a refractive index of the first light blocking layer is less than a refractive index of the first color conversion layer, the second color conversion layer, or the third color conversion layer, and the refractive index of the first light blocking layer ranges from 1.2 to 1.5.

9. The organic light emitting diode display of claim 1, wherein
   the first light blocking layer includes a low refractive index layer and a high refractive index layer.

10. An organic light emitting diode display, comprising:
    a display panel; and
    a color conversion panel disposed on the display panel, wherein the color conversion panel includes:
       a substrate;
       a second light blocking layer disposed under the substrate;
       a color filter layer disposed under the second light blocking layer, wherein the color filter layer includes a first color filter, a second color filter, and a third color filter; and
       a first color conversion layer, a second color conversion layer, and a third color conversion layer respectively disposed under the first color filter, the second color filter, and the third color filter,
       the second light blocking layer includes a first portion that overlaps the first color filter, a second portion that overlaps the second color filter, and a third portion that overlaps the third color filter, and
       the first portion, the second portion, and the third portion are extended to one another.

11. The organic light emitting diode display of claim 10, wherein
    the color conversion panel includes a first light blocking member disposed under the substrate and positioned between at least one pair of adjacent, different color filters.

12. The organic light emitting diode display of claim 10, wherein
    the color conversion panel includes a second light blocking member disposed under the color filter layer and positioned between at least one pair of adjacent, different color conversion layers.

13. The organic light emitting diode display of claim 12, further comprising a first light blocking layer disposed between the first color conversion layer, the second color conversion layer, and the third color conversion layer, and the first color filter, the second color filter, and the third color filter, wherein the first light blocking layer includes a first portion that overlaps the first color filter, a second portion that overlaps the second color filter, and a third portion that overlaps the third color filter, and the first portion, the second portion, and the third portion are extended to one another.

14. The organic light emitting diode display of claim 10, wherein a refractive index of the second light blocking layer is less than a refractive index of the first color filter, the second color filter, or the third color filter, and the refractive index of the second light blocking layer ranges from 1.2 to 1.5.

15. The organic light emitting diode display of claim 10, wherein a refractive index of the second light blocking layer is greater than a refractive index of the substrate, and the refractive index of the second light blocking layer ranges from 1.9 to 2.1.

16. An organic light emitting diode display, comprising:
a display panel; and
a color conversion panel disposed on the display panel, wherein the color conversion panel includes:
a substrate;
a color filter layer disposed under the substrate;
a first light blocking layer disposed under the color filter layer;
a first color conversion layer, a second color conversion layer, and a third color conversion layer disposed under the first light blocking layer; and
a second light blocking member disposed under the color filter layer and positioned between at least one pair of adjacent, different color conversion layers,
wherein the color filter layer includes a first color filter, a second color filter, and a third color filter,
the first light blocking layer includes a first portion that overlaps the second light blocking member in a plan view and a second portion that overlaps the color filter layer, and
the first portion is disposed under the second light blocking member.

17. The organic light emitting diode display of claim 16, wherein the color conversion panel further includes a first light blocking member disposed under the substrate and positioned between at least one pair of adjacent, different color filters.

18. The organic light emitting diode display of claim 16, wherein the first color conversion layer and the second color conversion layer each include a quantum dot, and the third color conversion layer includes a scatterer.

19. The organic light emitting diode display of claim 16, further comprising a reflection preventing layer disposed on the substrate.

20. The organic light emitting diode display of claim 16, wherein the first light blocking layer includes at least one of ITO, IZO, or SiNx.

* * * * *